(12) United States Patent
Decaens

(10) Patent No.: US 10,396,813 B2
(45) Date of Patent: Aug. 27, 2019

(54) SUCCESSIVE APPROXIMATION ANALOG-TO-DIGITAL CONVERTER

(71) Applicant: SOCIÉTÉ FRANÇAISE DE DÉTECTEURS INFRARAOUGES—SOFRADIR, Palaiseau (FR)

(72) Inventor: Gilbert Decaens, Grenoble (FR)

(73) Assignee: SOCIETE FRANCAISE DE DETECTEURS INFRAROUGES—SOFRADIR, Palaiseau (FR)

( * ) Notice: Subject to any disclaimer, the term of this patent is extended or adjusted under 35 U.S.C. 154(b) by 0 days.

(21) Appl. No.: 15/777,608

(22) PCT Filed: Nov. 10, 2016

(86) PCT No.: PCT/FR2016/052929
§ 371 (c)(1),
(2) Date: May 18, 2018

(87) PCT Pub. No.: WO2017/081423
PCT Pub. Date: May 18, 2017

(65) Prior Publication Data
US 2019/0181875 A1    Jun. 13, 2019

(30) Foreign Application Priority Data
Nov. 13, 2015  (FR) ..................... 15 60873

(51) Int. Cl.
*H03M 1/38* (2006.01)
*H03M 1/16* (2006.01)

(52) U.S. Cl.
CPC ........... *H03M 1/162* (2013.01); *H03M 1/168* (2013.01)

(58) Field of Classification Search
CPC ...... H03M 1/162; H03M 1/164; H03M 1/165; H03M 1/167; H03M 1/403; H03M 1/12;
(Continued)

(56) References Cited

U.S. PATENT DOCUMENTS

| 5,416,485 A * | 5/1995 | Lee ........................ H03M 1/066 341/162 |
| 6,320,530 B1 * | 11/2001 | Horie .................... H03M 1/144 341/163 |

(Continued)

FOREIGN PATENT DOCUMENTS

JP    2005-252326 A    9/2005

OTHER PUBLICATIONS

Ogawa et al., "A High Speed, Switched-Capacitor Analog-to-Digital Converter Using Unity-Gain Buffers," IEICE transactions on Fundamentals of Electronics, Communications and Computer Sciences, Engineering Sciences Society, Jun. 1993, vol. 76A, No. 6, pp. 924-930.

(Continued)

*Primary Examiner* — Linh V Nguyen
(74) *Attorney, Agent, or Firm* — Oliff PLC

(57) ABSTRACT

The analog-to-digital converter includes a first stage in which a voltage to be converted is applied to the input of a first comparator. The first comparator delivers, on a first digital output, a first digital result representative of the comparison between the voltage to be converted and the comparison voltage. The first digital output is connected to a calculator of a first intermediate voltage. A second comparator compares the first intermediate voltage with the comparison voltage and delivers a second digital result on a second digital output terminal. The second digital output terminal is connected to a second calculator of residual voltage that is a function of the voltage to be converted, of (Continued)

first and second voltages and of the first and second digital results. The first calculator is formed by the second calculator.

14 Claims, 8 Drawing Sheets

(58) Field of Classification Search
CPC ........ H03M 1/145; H03M 1/56; H03M 1/066; H03M 1/0695; H03M 1/1245; H03M 1/442; H03M 1/804
USPC ................................. 341/155, 156, 161, 172
See application file for complete search history.

(56) References Cited

U.S. PATENT DOCUMENTS

| | | | |
|---|---|---|---|
| 6,600,440 B1* | 7/2003 | Sakurai | H03M 1/0619 341/155 |
| 6,617,992 B2* | 9/2003 | Sakurai | H03M 1/0619 341/161 |
| 6,784,824 B1* | 8/2004 | Quinn | G06G 7/14 341/120 |
| 8,344,926 B2 | 1/2013 | Decaens | |
| 8,405,538 B2* | 3/2013 | Makihara | H03M 1/1225 341/163 |
| 8,994,572 B2* | 3/2015 | San | H03M 1/0695 341/118 |
| 2005/0219097 A1* | 10/2005 | Atriss | H03M 1/162 341/144 |
| 2007/0035462 A1* | 2/2007 | Hertel | H01Q 9/065 343/795 |
| 2009/0322577 A1* | 12/2009 | Johansson | H03M 1/0673 341/155 |
| 2010/0085229 A1 | 4/2010 | Nam et al. | |
| 2011/0102229 A1 | 5/2011 | Decaens | |
| 2011/0298645 A1* | 12/2011 | Bales | H03M 1/1225 341/161 |
| 2012/0026026 A1* | 2/2012 | Kabir | H03M 1/1225 341/158 |
| 2016/0043733 A1* | 2/2016 | Nezuka | H03M 3/464 341/143 |

OTHER PUBLICATIONS

Ginetti et al., "A CMOS 13-b Cyclic RSD A/D Converter," IEEE Journal of Solid-State Circuits, Jul. 1992, vol. 27, No. 7, pp. 957-964.

Kim et al., "A 10 MS/s 11-bit 0.19 mm2 Algorithmic ADC With Improved Clocking Scheme," IEEE Journal of Solid-State Circuits, Sep. 2009, vol. 44, No. 9, pp. 2348-2355.

Nagaraj et al., "Efficient Circuit Configurations for Algorithmic Analog to Digital Converters," IEEE Transactions on Circuits and Systems II: Analog and Digital Signal Processing, Dec. 1993, vol. 40, No. 12, pp. 777-785.

Ho et al., "Switched Capacitor Circuits in the Implementation of Multiple-Valued Logic," IEEE Proceedings of the Nineteenth International Symposium on Multiple-Valued Logic, May 1989, pp. 202-209.

Furuta et al., "A 10-bit, 40-MS/s, 1.21 mW Pipelined SAR ADC Using Single-Ended 1.5-bit/cycle Conversion Technique," IEEE Journal of Solid-State Circuits, Jun. 2011, vol. 46, No. 6, pp. 1360-1370.

Zhu et al., "A 50-fJ 10-b 160-MS/s Pipelined—SAR ADC Decoupled Flip-Around MDAC and Self-Embedded Offset Cancellation," IEEE Journal of Solid-State Circuits, Nov. 2012, vol. 47, No. 11, pp. 2614-2626.

* cited by examiner

SUCCESSIVE APPROXIMATION ANALOG-TO-DIGITAL CONVERTER

FIELD OF THE INVENTION

The invention relates to a successive approximation analog-to-digital converter.

STATE OF THE ART

Conversion of an analog signal into a digital signal is performed in conventional manner by means of analog-to-digital converters. Several types of analog-to-digital converters are known and their uses are defined according to the conversion time, their precision as well as to their manufacturing cost which takes account of the difficulties of fabrication and/or of the surface used on a chip and/or of the consumption. Converters can be divided into different categories, the most widely known being flash converters, pipeline converters, successive approximation converters, ramp converters and Sigma-Delta converters.

Successive approximation converters are looped systems built around a single stage formed by a one-bit converter. Conversion of the voltage to be converted Vin is performed bit by bit at each new iteration, i.e. by means of successive clock cycles, starting from the Most Significant Bit and finishing with the Least Significant Bit. To convert a voltage Vin on n bits, a minimum of n iterations are therefore required. It then becomes obviously apparent that the higher the digital resolution required, the larger the number of conversion bits required and the longer the conversion time.

Operation of such a cyclic converter can be explained in the following manner. The voltage to be converted Vin is comprised in a range of predefined voltages bounded by first and second voltages. This voltage range is divided into two equal sub-ranges, a first sub-range comprising the lowest voltages and the second sub-range comprising the highest voltages. Bounding of these sub-ranges is performed by means of a comparison voltage Vref. It is then sought to know in which sub-range voltage Vin is situated. Depending on whether the voltage to be converted is situated in the sub-range of the initial range containing the lowest values or in the sub-range containing the highest values, a '0' or a '1' is respectively assigned to the highest bit representative of the comparison with comparison voltage Vref. The sub-range comprising voltage Vin is then further divided into two equal parts and it is again sought to know which part the voltage to be defined belongs to, and a second bit equal to 1 or 0 is defined from this new comparison and so on according to the required resolution.

Two approaches can be envisaged to perform this conversion. In a first approach, a reference voltage is subtracted from the voltage representative of the voltage to be converted. Depending on whether the calculated bit is equal to 1 or 0, the value of the reference voltage is equal to the comparison voltage or is zero so as to represent the new accessible range at the next iteration, i.e. the sub-range of the previous iteration which comprised the voltage to be converted.

In a second approach, which is equivalent from the conversion result standpoint, the voltages defining the accessible ranges are fixed and it is voltage to be converted Vin (which is multiplied by two) from which a reference value has been subtracted to define the intermediate voltage.

The value of the reference voltage is equal to one of the boundaries of the accessible voltage range according to the value of the bit to define the intermediate voltage.

Depending on whether the voltage to be converted is situated in one or the other of the sub-ranges, an intermediate voltage Vi representative of the voltage to be converted is calculated from the voltage to be converted and the reference voltage. This intermediate voltage Vi is the voltage to be converted at the next iteration or on the next block, i.e. the voltage used for determining the next bit.

A typical example of a successive approximation converter is a converter of cyclic or algorithmic type illustrated in FIG. 1.

In a cyclic converter, voltage to be converted Vin is successively compared with a binary fraction of a comparison voltage Vref which is more and more precise with each successive clock cycle. Voltage to be converted Vin and all the intermediate voltages Vi are compared with comparison voltage Vref.

Voltage to be converted Vin is applied on an input of a first sample and hold stage. The output terminal of first sample and hold stage 1 is connected to a first input of a first comparator 2 with digital output on one bit. Comparison voltage Vref is applied on the second input of digital output comparator 2. The output terminal of the comparator 2 then delivers a bit Bi representative of the comparison between the voltages applied on its two input terminals. The output terminal of comparator 2 is connected to a register which stores the delivered bit Bi. The output terminal of the comparator is also connected to an input terminal of means for calculating 3 a first intermediate voltage V1, such as a calculator of first intermediate voltage V1. First intermediate voltage V1 is representative of voltage $2Vin-(Va+Vb)/2+ Bi\cdot(Va-Vb)/2+\overline{Bi}\cdot(Vb-Va)/2$ according to the approach used for management of the voltages when the iterations are performed, as explained in the foregoing. According to the value of bit Bi, calculator 3 deliver a voltage V1 representative of 2Vin−Vb or 2Vin−Va on output which corresponds to the residue of analog type that is applied on the input of the next converter stage used to convert voltage Vin on a second bit. The output terminal of calculator 3 can then be connected to the input of this same stage (FIG. 1) or to the input of the next stage (typically in a pipeline architecture that is not represented).

By means of this architecture, voltage to be converted Vin is thus applied on the input of first sample and hold stage 1 which stores the latter in memory throughout the iteration. On output of first sample and hold stage 1, voltage Vin is compared with comparison voltage Vref by first digital comparator 2 which delivers a bit Bi representative of the comparison on output. By convention, if voltage Vin is greater than voltage Vref, first comparator 2 sends a '1', in the opposite case it sends a '0'. This representative bit Bi is recorded in a register (not shown), and is also applied to calculator 3 of the first intermediate voltage V1. At each iteration, the same converter therefore determines a bit representative of voltage to be converted Vin although this voltage is not really applied on the converter throughout the conversion. In the second iteration and the following iterations, conversion is in fact performed on first intermediate voltage V1 which is representative of the voltage to be converted and of the following intermediate voltages representative of the previous intermediate voltages.

An example embodiment is described in the publication by Ogawa et al. 'A High Speed Switched-Capacitor Analog-to-Digital Converter Using Unity-Gain Buffers' IEICE transactions on Fundamentals of Electronics, Communications and Computer Sciences, Engineering Sciences Society Vol/76A, n° 6, 1993, pp 924-930. In this embodiment, two comparators are connected in series and are arranged in such a way as to use the two phases of a clock signal to successively generate the two bits from the voltage to be converted and from the intermediate voltage.

In general manner, successive approximation converters are limited to resolution on 10 bits as the imprecisions on the different voltages degrade the precision of the final digital result and conversion on more than 16 bits does not give more precision than conversion on 10 bits on account of the successive errors introduced at each iteration.

A solution to this problem is proposed in the document U.S. Pat. No. 8,344,926 where the converter performs multiplication of the signal by a factor 2 and by a factor 4 in order to perform conversion on 2 bits in a single stage. The proposed solution is efficient but results in a greater complexity.

OBJECT OF THE INVENTION

The object of the invention is to provide a converter which is easier to implement while at the same time guaranteeing a greater precision in digital conversion on n bits of an analog voltage, and which makes it possible to have a reduced converter surface to be used in embedded systems.

Such a result tends to be achieved by means of a converter comprising:

- an input terminal of the stage to which a voltage to be converted is applied, the voltage to be converted being comprised in a conversion range bounded by first and second voltages,
- a first comparator of the voltage to be converted with at least a first comparison voltage, said first comparator delivering, on a first digital output, a first digital value on at least a first bit representative of said comparison,
- a first calculator delivering a first intermediate voltage according to the voltage to be converted, to the first digital result and to said first and second voltages,
- a second comparator of the first intermediate voltage with at least a second comparison voltage, said second comparator delivering, on a second digital output, a second digital value on at least a second bit representative of said comparison,
- a second calculator of a second intermediate voltage delivering said second intermediate voltage from the voltage to be converted, the first and second digital results and said first and second voltages on a analog output of the converter, the second calculator being connected to the input terminal to receive the voltage to be converted.

The analog-to-digital converter is remarkable in that the first calculator and the second calculator are formed by the same calculator comprising an amplifier, the output of the amplifier delivering the first intermediate voltage and the second intermediate voltage.

The object of the invention is to provide an operating method of an analog-to-digital converter which comprises the following successive steps:

providing a converter as presented in the foregoing,
sampling the voltage to be converted during a first period,
comparing the voltage to be converted with a first comparison voltage by means of the first comparator,
calculating the first intermediate voltage by means of the calculator during a second period,
comparing the first intermediate voltage with a second comparison voltage by means of the second comparator,
calculating a second intermediate voltage by means of the calculator during a third period.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED EMBODIMENT OF THE INVENTION

As illustrated in FIGS. 2, 3, 4, 9, 10, 11 and 12, the analog-to-digital converter with successive approximation on at least two bits is composed of at least a first stage comprising an analog-to-digital converter on at least two bits Bi and $B_{i+1}$. This first stage comprises an input terminal on which the voltage to be converted Vin is applied. The first stage advantageously comprises two digital output terminals associated with bits Bi and $B_{i+1}$ and an analog output terminal A which can be associated with another stage or reconnected to the input of this first stage. In general manner, the converter is composed of at least a first stage whether it be for integration in a pipeline or a cyclic architecture. In the case of a cyclic architecture, it is advantageous to place a sample and hold module between the output and the input of the converter. It is also advantageous to manufacture a cyclic converter using two stages fitted head-to-tail. To deliver n bits, the converter advantageously presents n digital output terminals or less than n terminals.

Figure 1:
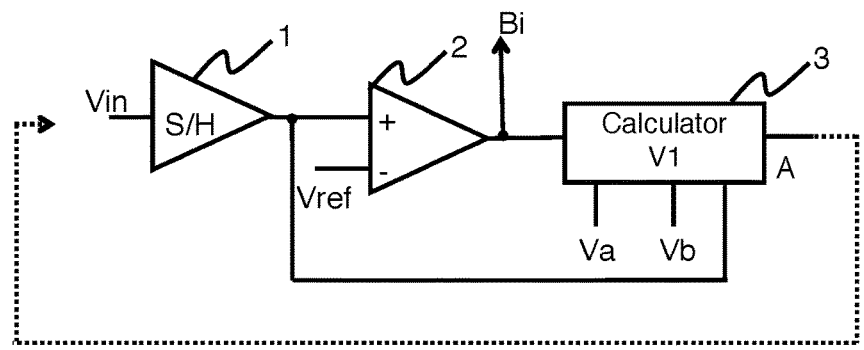
FIG. 1 represents a one-bit cyclic converter according to the prior art, in schematic manner.
Figure 2:
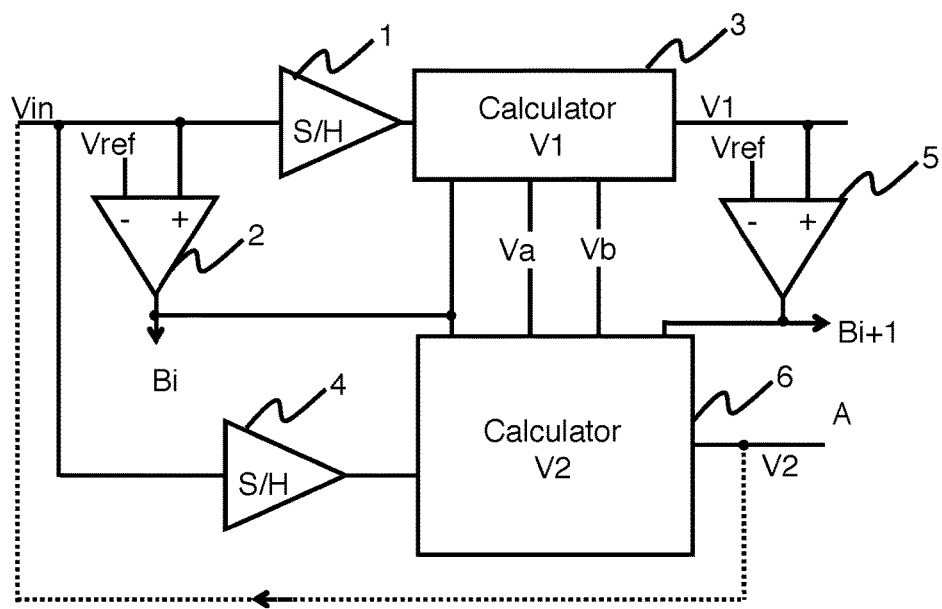
FIG. 2 represents a two-bit successive approximation converter according to the prior art, in schematic manner.

In a pipeline architecture, the analog output terminal A of the stage represented in FIG. 2 is connected to an input of a converter of the same type forming the next step (not represented). In this way, the first stage converts the first two bits of voltage to be converted Vin and provides the next stage with an analog residue, i.e. a residual voltage V2, which is converted to form the next two bits. There is then, in this example, conversion of voltage Vin on at least four bits.

Figure 4:
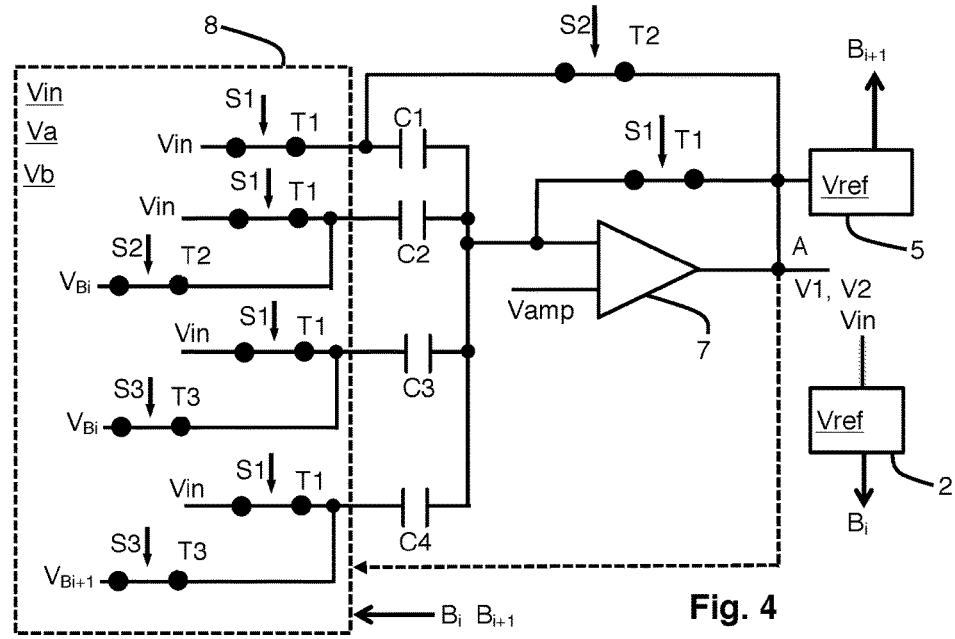
Figure 9:
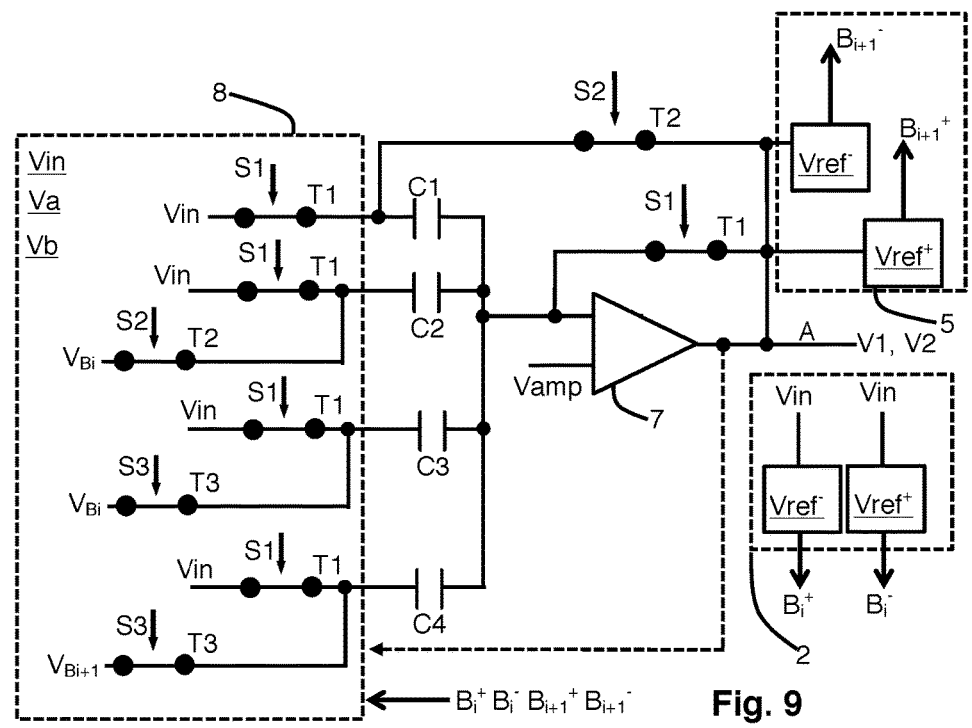
FIG. 9 represents a particular alternative embodiment of a converter represented in FIG. 4, FIGS. 10 and 11 represent particular alternative embodiments of a converter represented in FIG. 4.

In an architecture called cyclic architecture represented in FIGS. 2, 4 and 9, there is only one analog-to-digital converter stage, the first stage, and advantageously a sample and hold module. The analog output terminal A is then reconnected to the input terminal of the single first stage. In this way, at each iteration, the converter converts two bits of voltage to be converted Vin. At the first iteration, the converter delivers the first and second bits from voltage to be converted Vin. At the second clock cycle or the next iteration, the converter delivers the third and fourth bits from the analog residue, i.e. voltage V2 delivered in the previous cycle. Reconnection between analog output terminal A and the input terminal is performed in conventional manner.

In general manner, a 2-bit analog-to-digital converter can be obtained by adding n successive two-bit converter stages (pipeline architecture) or by making at least n conversion groups on two bits on the first stage (cyclic converter) or on two stages head-to-tail. The two-bit converter can be replaced by a converter delivering more than 2 bits.

Figure 3:
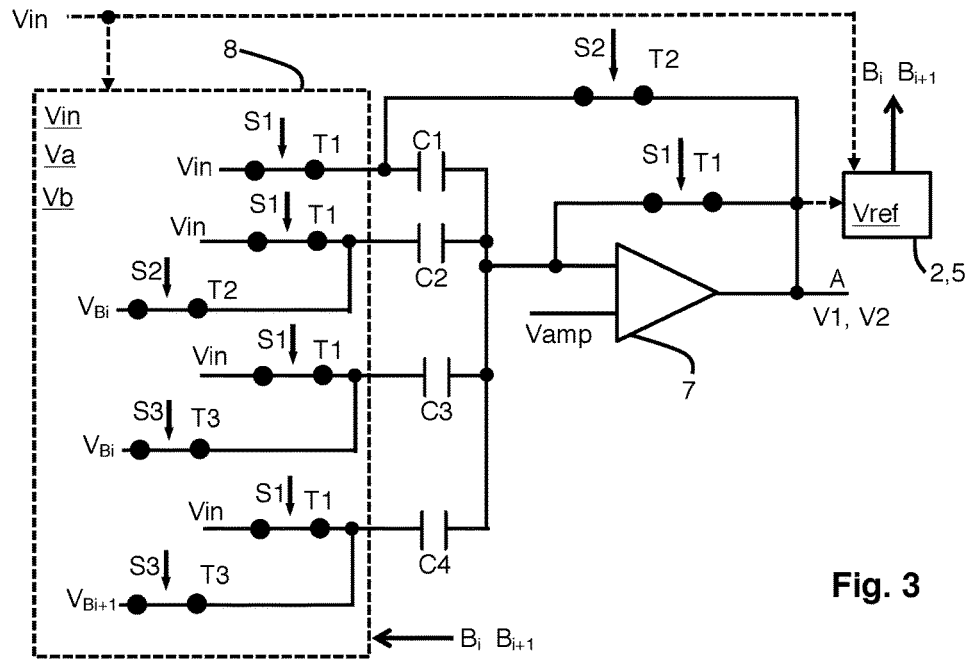
FIGS. 3 and 4 represent two particular embodiments of a two-bit converter according to the invention.

In conventional manner, voltage to be converted Vin is comprised between a first voltage Va and second voltage Vb which represent the limits of the range accessible to voltage Vin. Second voltage Vb is higher than first voltage Va. According to the different possible embodiments, the accessible range is divided into at least two portions which are bounded by at least a first reference voltage Vref. If the accessible range comprises an even number of sub-ranges, the range is divided into equal sub-ranges. If the accessible range comprises an odd number of sub-ranges, the extent of the different sub-ranges can be variable. Advantageously, the accessible range is divided into two or three sub-ranges. In the particular case where the range is divided into two equal portions, bounding is performed by a single comparison voltage Vref which is equal to (Va+Vb)/2. FIGS. 3 and 4 represent a breakdown of the voltage range into two sub-ranges.

For example purposes, if the first and second voltages are equal in absolute value, but of opposite sign (Va=−Vb), the comparison voltage is then zero (Vref=0). If the first and second voltages are respectively at 0 and V (Va=0, Vb=V), the comparison voltage Vref is then equal to V/2. The comparison voltage is located at the equipotential of voltages Va and Vb.

It is also possible to divide the range into more than two portions, typically three portions, in order to avoid errors of the means for comparing. In this embodiment, illustrated in FIG. 9, voltage to be converted Vin is compared with several comparison voltages, for example first and second elementary comparison voltages Vref⁻ and Vref⁺. An example of implementation of these means for comparing is described for example by Ginetti et al 'A CMOS 13-b Cyclic RSD A/D Converter' IEEE Journal of Solid-State Circuits Vol. 27, No 7, July 1992.

In conventional manner, the converter can modify voltage to be converted Vin between two iterations or it can modify the voltages bounding the accessible range and comparison voltage Vref. In one embodiment, voltage to be converted Vin is therefore multiplied for example by a factor two or by a factor four whereas in another embodiment, the accessible range is divided by two or by four by modifying the limit voltages.

As specified in the foregoing, depending on the embodiment used, first and second voltages Va and Vb can be identical between the different stages and within a stage, but these voltages can also change between the different stages and within the stages in order to represent the voltage ranges accessible to the voltage to be converted or to its representative voltage which will be converted.

As illustrated in FIG. 2, the first stage of the converter comprises, in schematic manner, first means for comparing 2 with a digital output, for example a first comparator with a digital output. The first means for comparing is configured to compare the voltage to be converted Vin with at least the first comparison voltage Vref1 representative of division of the range of accessible voltages into at least two sub-ranges.

This first digital-output comparator 2 delivers a first digital value on at least a first bit Bi, on the first digital output terminal of the first stage, which value is representative of the comparison between voltage to be converted Vin and the comparison voltage or voltages. For example purposes, if the range is divided into two sub-ranges, first comparator 2 delivers a first bit and if the range is divided into three sub-ranges, the first means for comparing deliver two bits.

The first stage also comprises first means for calculating 3, such as a first calculator, delivering a first intermediate voltage V1. This first intermediate voltage V1 is a function of voltage to be converted Vin, of the value of the first digital result (at least first bit Bi) and of first Va and second Vb voltages. In this way, first means for calculating 3 are connected directly to voltage Vin and deliver on output intermediate voltage V1 originating from voltage Vin of first and second voltages Va and Vb and from the value of first bit Bi.

First means for calculating 3 are direct means for calculating as the voltage delivered on output comes directly from the value of voltage to be converted Vin. As in the prior art, a sample and hold stage can be used to provide voltage Vin to the converter or to certain components of the converter. The sample and hold stage enables sampling of voltage Vin to be made and therefore enables a constant voltage to be delivered to the input of calculating means 3.

By convention, voltage to be converted Vin is situated in a first range of voltages which is bounded by the first and second voltages and first intermediate voltage V1 is situated in a second range of voltages. This second range of voltages is representative of the sub-range of the first range of voltages which contained voltage to be converted Vin. Each intermediate voltage is therefore situated in a dedicated range.

Second means for comparing 5 with a digital output on at least one bit are also integrated in the first stage. These second digital means for comparing 5, such as a second comparator with digital output, compare first intermediate voltage V1 with at least a second voltage representative of division of the second range into at least two sub-ranges.

As for the first range, the second range can be divided by an even or odd number of sub-ranges. The second range can be divided by an even number of equal sub-ranges or by an odd number of sub-ranges having a variable scope. In the case of a range divided into two sub-ranges bounded by the reference voltage, second digital means for comparing 5 compare first intermediate voltage V1 with comparison voltage Vref2.

Second digital output comparator 5 delivers a second digital value on output, at least a second bit $B_{i+1}$ on the second digital output terminal of the first stage. This second digital value is representative of the comparison between first intermediate voltage V1 and the comparison voltage or voltages.

In the case of division of each range into two sub-ranges, the comparison voltage which is compared with intermediate voltage V1 can be of identical, or different, value to the voltage which was used as reference for comparison of voltage to be converted Vin. The value of comparison voltage Vref2 between these two comparisons steps depends on the management mode of the voltages between the different sub-ranges as was explained in the foregoing. The same is the case for the multiple comparison voltages used for each comparator when the range is divided into more than two sub-ranges.

Second means for calculating 6 a residual voltage V2, such as a second calculator, are used and deliver residual voltage V2 on analog output A of the first stage. Residual voltage V2 is a function of voltage to be converted Vin, of the values of the first and second digital results and of first and second voltages Va and Vb. In the case of a 2-bit converter, voltage V2 is called residual voltage. In the case of a converter on more than 2 bits, voltage V2 is called second intermediate voltage.

Second means for calculating 6 are also direct means for calculating as residual voltage V2 comes directly from voltage to be converted Vin, from the values of first and second voltages Va and Vb and from the values of the first and second bits. Residual voltage V2 is obtained directly from voltage Vin and not from intermediate voltage V1. Although the intermediate voltage originates from voltage Vin, voltage Vin is modified and therefore impaired to obtain the intermediate voltage. Not using voltage V1 in analog manner reduces impairment of the signal to be converted to determine the bits.

Residual voltage V2 obtained from second means for calculating 6 is therefore less sensitive to conversion errors. Voltage to be converted Vin is applied directly to the input of second means for calculating 6. The analog output of the second means for calculating its reapplied on its input or on the input of the next stage. In the case of a cyclic architecture, the analog output of the second means for calculating 6 is applied to the input of the same second means for calculating 6. A sample and hold stage is advantageously used for a cyclic converter. It is also advantageous to use two stages connected head-to-tail.

In a particularly advantageous manner illustrated in FIGS. 3 to 6, first calculator 3 and second calculator 6 are formed by the same amplifier 7 which makes for a large gain in compactness. First calculator 3 and second calculator 6 are formed by common elements, for example amplifier, at least two switches and a voltage source which are mutualised. Preferably, at least two capacitors are also mutualised to deliver voltages V1 and V2.

Using the same calculator to calculate intermediate voltage V1 and residual voltage V2 makes it possible to perform a single sampling period. Such an architecture is therefore advantageous as it enables all the capacitors to be charged during the same period which reduces the constraints in the whole information processing chain from acquisition of the analog data through to final processing of the digital information.

In an even more advantageous embodiment illustrated in FIG. 3, this architecture also enables a gain in compactness to be made by using the same comparator to form first comparator 2 and second comparator 5. In other words, a single comparator can form first comparator 3 and second comparator 5. It is then advantageous to provide a selector switch which is configured to connect the input terminal of comparator 2, 5 to the output terminal of amplifier 7 or to the input terminal receiving voltage to be converted Vin in order to compare voltage to be converted Vin or first intermediate voltage V1.

In the embodiments illustrated in FIGS. 3 to 7 and 9 to 12, voltage to be converted Vin is applied directly to the calculator input, by means of a sample and hold stage, or not.

The analog input of the stage supplies the calculator. The analog output of the calculator forms the analog output of the stage or more generally of the converter.

In particular embodiments which will be described in the following, the first stage can comprise additional elements in order to enable transfer of the different data in time, in organised manner. To do this, the first stage will for example comprise sample and hold units.

In the embodiment illustrated in FIG. 2 schematising the functionalities of the converter, the first stage of the analog-to-digital converter comprises a first sample and hold stage 1 connected to the input terminal of the first stage. Voltage to be converted Vin is therefore applied to the input of first sample and hold stage 1. First sample and hold stage 1 comprises a control input, not represented, which makes it possible to define the time at which the voltage imposed on the input of first sample and hold stage 1 has to be sampled. After sampling, the measured voltage is then delivered on the output terminal of first sample and hold stage 1 until a new control signal is applied to the control terminal. In advantageous manner, the measured voltage is delivered throughout the time of the first phase of the iteration. The voltage delivered by the output of first sample and hold stage 1 is equal to voltage to be converted Vin or very close, the sample and hold stage not being perfect. The quality of the final result of the converter depends, in non-negligible manner, on the quality of the sample and hold stages used. In order to keep a high conversion quality, this architecture uses a small number of sample and hold stages compared with the digital results obtained with converters on one bit of the state of the art.

Voltage Vin is connected to a first input terminal of first means for comparing 2 with digital output on one bit which is here formed by a first comparator having a digital output on one bit.

Comparison voltage Vref is applied to the second input terminal of first comparator 2 which then compares reference voltage Vref with voltage to be converted Vin. Depending on the result of the comparison between the voltages at its terminals, first comparator 2 delivers a first digital result or first digital value, for example a first bit Bi which can be equal to 1 or to 0. By convention, if the range is divided into two sub-ranges, the bit is equal to 1 if the voltage is higher than the comparison voltage and is otherwise equal to 0. The first bit Bi is equal to 0 or to 1 by convention, but in reality the value 1 represents the value of the supply from the comparator. This first bit Bi corresponds to the most significant bit of the digital conversion. This first bit is delivered to the outside by the first digital output terminal of the first stage.

The output terminal of first digital output comparator 2 is connected to a register (not represented) which stores the digital result, typically of bit Bi (the bit only being able to be equal to '0' or '1'). The output terminal of first comparator 2 is also connected to the input of calculator 3 of first intermediate voltage V1.

Comparison voltage Vref is applied to a second input of second comparator 5. Second comparator 5 then compares comparison voltage Vref with first intermediate voltage V1 and delivers second conversion bit $B_{i+1}$ on output, on a second digital output of the converter. The value of second bit $B_{i+1}$ is equal to 0 or 1 depending on the result of the comparison here between comparison voltage Vref and first intermediate voltage V1.

The values of first bit Bi and of second bit $B_{i+1}$ will enable the converter to calculate a residual voltage V2 by means of second calculator 6.

Voltages V1 and V2 are calculated differently by means of the calculator represented schematically by two different calculators to illustrate its two different operating methods.

As illustrated in FIGS. 3 and 4, the calculator comprises an amplifier 7 having a first input terminal and an output terminal. The output terminal of amplifier 7 advantageously forms output terminal A of the converter. Amplifier 7 comprises a second input terminal connected to an amplification voltage Vamp generator.

Using a single calculator enables a gain in compactness to be made as amplifier 7 is mutualised to calculate voltage V1 and voltage V2.

The first input of amplifier 7 is connected to the output of amplifier 7 by means of first switch T1. In advantageous manner, first switch T1 directly connects the first input of amplifier 7 with the output of amplifier 7.

The first input is also connected to at least four power supply lines connected in parallel or also called connections. Each power supply line comprises a capacitor having a first terminal connected to the first input of amplifier 7. The second terminal of each capacitor is connected to a voltage source 8. The four lines of the converter form a part of the calculator and store the sampled voltage values.

The four power supply lines are respectively named first, second, third and fourth power supply lines. The four capacitors are named first, second, third and fourth capacitors C1, C2, C3 and C4.

Voltage source 8 is configured so as to apply a specific voltage to each of the power supply lines in time. According to the periods, the voltages can be identical on the power supply lines or they can be different. By adjusting the voltages applied on the capacitors, calculations of voltages V1 and V2 can be easily performed.

A second switch T2 is connected in such a way as to connect the second terminal of first capacitor C1 to the output terminal of the amplifier. In advantageous manner, second switch T2 connects the second terminal of first capacitor C1 directly with the output of amplifier 7 to facilitate calculation of voltages V1 and V2.

Second comparator 5 is connected to the output terminal of the amplifier so as to be able to compare voltage V1 with a reference.

By means of first and second switches T1 and T2 and by means of connection or disconnection of the first, second, third and fourth power supply lines, amplifier 7 can calculate first intermediate voltage V1 or second residual voltage V2. In other words, amplifier 7 associated with the first and second switches, with the first and second power supply lines and with voltage source 8 forms first calculator 3 designed to calculate first intermediate voltage V1.

Voltage source 8 receives the result from first comparator 2 in order to provide the suitable voltage on the second power supply line and on the third power supply line.

Voltage source 8 receives the result from second comparator 5 in order to provide the suitable voltage on the fourth power supply line. It is then possible to calculate residual voltage V2.

In the embodiment of FIG. 3, voltage to be converted Vin is supplied to voltage source 8 and it can be applied on comparator 2 to deliver the first bit. The voltage to be converted is provided by any suitable means. For example, switch T2 is actuated so that voltage Vin applied on capacitor C1 during a first period is then measured by comparator 2 to calculate the first bit. In all cases, the comparator is advantageously configured so as to avoid connecting the input and output of amplifier 7 at the same time. In this embodiment, a single comparator can be used.

In the embodiment of FIG. 4, voltage to be converted Vin is supplied to a first comparator 2 which delivers the first bit. FIG. 4 also illustrates the connection which connects the output terminal of amplifier 7 to voltage source 8 to form a cyclic converter. This connection can also be used in the embodiment of FIG. 3.

Figure 5:
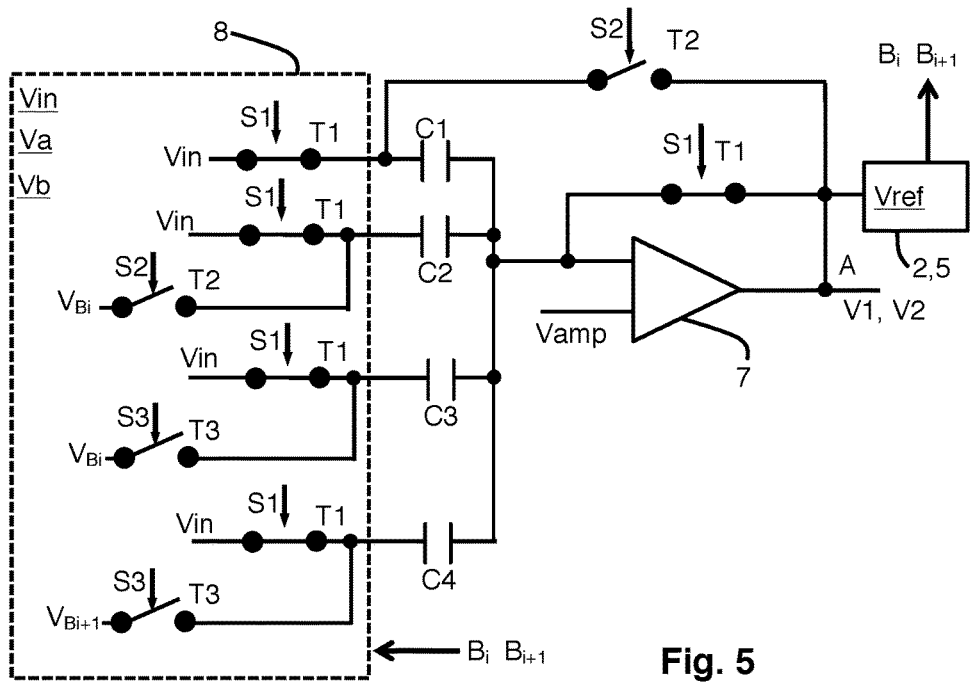
FIGS. 5, 6 and 7 represent different steps of operation of a two-bit successive approximation converter according to the invention, in schematic manner.

As illustrated in FIG. 5, voltage source 8 is configured so as to apply voltage to be converted Vin on the second terminals of the first, second, third and fourth capacitors during a first period. The four capacitors are charged at the same time.

Figure 6:
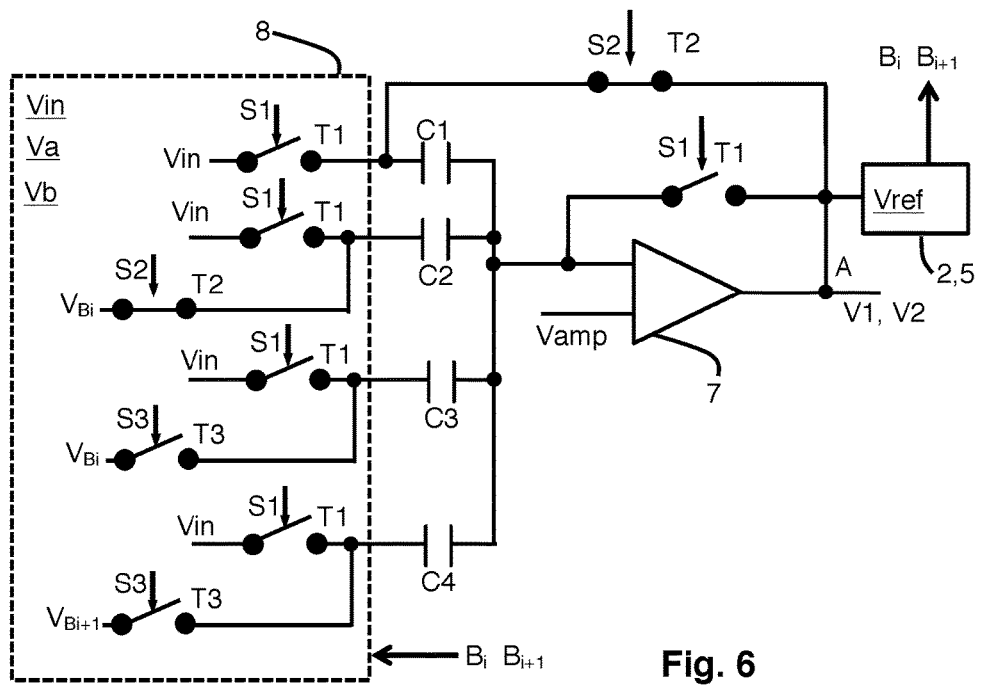

As illustrated in FIG. 6, voltage source 8 is configured so as to apply a first reference voltage $V_{Bi}$, for example voltage Va or voltage Vb, on the second terminal of second capacitor C2 during a second period. During the second period, voltage source 8 does not supply any voltage on the second terminal of first capacitor C1, on the second terminal of third capacitor C3 and on the second terminal of fourth capacitor C4. The second terminals of third capacitor C3 and fourth capacitor C4 are at floating potential. The second terminal of first capacitor C1 is connected to the output of amplifier 7. In the particular embodiment illustrated in FIG. 9, voltage source 8 is configured so as to apply a first reference voltage $V_{Bi}$, for example voltage Va, Vb or (Va+Vb)/2.

Figure 7:
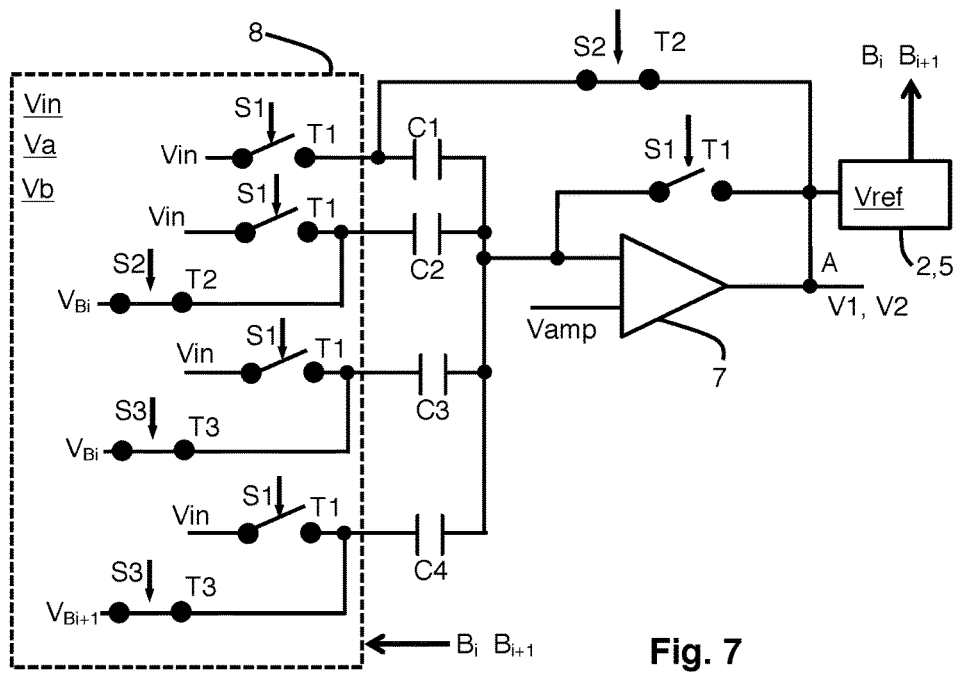

As illustrated in FIG. 7, during a third period, voltage source 8 is configured in such a way as to apply first reference voltage $V_{Bi}$ on the second terminals of second and third capacitor C2 and C3 and a second reference voltage $V_{Bi+1}$, for example voltage Va or voltage Vb, on the second terminal of fourth capacitor C4. During this third period, voltage source 8 does not supply any voltage on the second terminal of first capacitor C1. In the particular embodiment illustrated in FIG. 9, voltage source 8 is configured so as to apply a second reference voltage $V_{Bi+1}$, for example voltage Va, Vb or (Va+Vb)/2.

As indicated in the foregoing, in conventional manner, the value of first reference voltage $V_{Bi}$ and the value of second reference voltage $V_{Bi+1}$ are functions of the first and second digital values and of voltages Va and Vb. In the figures, the reference values delivered by source 8 are equal to voltages Va, Vb or (Va+Vb)/2, but another value is also possible.

First switch T1 is in closed state and therefore on during the first period (FIG. 5). The first input terminal of amplifier 7 is connected to the output terminal of amplifier 7 which advantageously enables the amplifier to be made to operate as a follower. Second switch T2 is in open state during the first period.

Second switch T2 is in closed state and therefore on during the second period. The second terminal of first capacitor C1 is electrically connected to the output terminal of the amplifier by means of switch T2 which enables the calculation result between the capacitors to be applied on the input of the comparator. First switch T1 is in open state and therefore off during the second period. Second switch T2 is in closed state and therefore on during the third period (FIG. 7). First switch T1 is in open state and therefore off during the third period.

The second period is different from the first period. The second period is subsequent to the first period. First switch T1 is not in closed state at the same time as second switch T2.

The third period is different from the first period and from the second period. The third period is subsequent to the first period and to the second period.

The first period can be called sampling period. During the first period illustrated in FIG. 5, voltage to be converted Vin is applied on the four capacitors C1, C2, C3 and C4 which will charge. Sampling of voltage to be converted Vin is performed in a single step on the four capacitors which is particularly advantageous. The four capacitors are advantageously identical. During the first period, first switch T1 is in closed state and all the capacitors are subjected to the same bias conditions.

During the first period, it is possible to compare voltage to be converted Vin by means of first comparator 2. This sampling can be performed according to the embodiment of FIG. 4 where first comparator 2 is dissociated from second comparator 5. The first digital value is calculated during the first period.

As a variant, it is possible to compare voltage to be converted Vin by means of the comparator forming first and second comparators 2 and 5. For example, a direct electric connection can be made between one of the terminals delivering voltage Vin and comparator 2, 5 which is then disconnected from analog output terminal A. Comparison is made after the first period and before the second period or, as a variant, at the end of the first period.

During the second period illustrated in FIG. 6, second switch T2 is in closed state and first reference voltage $V_{Bi}$ is applied on second capacitor C2. First switch T1 is in open state. Third and fourth capacitors C3 and C4 not being biased, first and second capacitors C1 and C2 form first calculator 3 which delivers intermediate voltage V1. In conventional manner, first reference voltage $V_{Bi}$ is a function of the first digital value, here the value of first bit Bi.

The calculator of first intermediate voltage V1 therefore comprises a digital input terminal on which first bit Bi is applied. It also comprises terminals on which voltages respectively representative of voltage to be converted Vin, of first voltage Va and of second voltage Vb or voltage (Va+Vb)/2 are applied. The calculator of first intermediate voltage V1 also comprises an analog output terminal which delivers first intermediate voltage V1. First intermediate voltage V1 is calculated by means of capacitors and in particular capacitors C1 and C2 which were charged with voltage Vin and capacitor C2 which now receives voltage $V_{Bi}$.

First intermediate voltage V1 is a function of voltage to be converted Vin, first voltage Va and second voltage Vb and the value of first bit Bi. First intermediate voltage V1 is equal to or representative of voltage 2Vin−(Va+Vb)/2+Bi·(Va−Vb)/2+$\overline{Bi}$·(Vb−Va)/2 in which $\overline{Bi}$ is equal to 1−Bi. First intermediate voltage V1 can also be written in the following form V1=2Vin−Bi·Vb−Bi·Va or a voltage representative of this formula.

First intermediate voltage V1 is delivered by the output of amplifier 7. Intermediate voltage V1 can be applied directly to the input of the second comparator. As an alternative, first intermediate voltage V1 can be applied to the input of a sample and hold stage before being applied to the input of the second comparator.

Voltage V1 is measured at a predefined time on the input terminal of the second comparator. Voltage V1 can be measured by the second comparator during the second period. Voltage V1 is measured before the third period. The second period can have a limited duration without this impacting the final result. Even if voltage V1 is not well established, this is not problematic as voltage V1 is used to define a bit and not to define the future voltage V2 at this time in analog manner. In advantageous manner, the duration of the second period is lower than the duration of the third period. In particularly advantageous manner, the duration of the second period is less than half of the duration of the third period which makes it possible to have a conversion of good quality in a limited time period. Calculation of voltage V1 can be terminated after comparison of voltage V1 with the reference voltage.

In the same way as the value of first bit Bi, the value of second bit $B_{i+1}$ is supplied to voltage source 8 so as to define the value of second reference voltage Vref2.

During the third period illustrated in FIG. 7, the second terminal of first capacitor C1 is connected to the output terminal of amplifier 7 for example by means of second switch T2. The second terminal of second capacitor C2 and the second terminal of third capacitor C3 receive first reference voltage $V_{Bi}$. The second terminal of fourth capacitor C4 receives second reference voltage $V_{Bi+1}$ which can be voltage Va, voltage Vb or voltage (Va+Vb)/2.

This residual voltage V2 which can be assimilated to a second intermediate voltage is a function of representative voltages, advantageously of the multiples, of first voltage Va and second voltage Vb, of voltage to be converted Vin and of first bit Bi and second bit $B_{i+1}$. Calculator 6 delivers residual voltage V2 on the analog output terminal A of the first stage, which voltage is equal to or representative of voltage 4Vin−(Va+Vb)+Bi·(Va−Vb)+$\overline{Bi}$·(Vb−Va)−(Va+Vb)/2+$B_{i+1}$·(Va−Vb)/2+$\overline{B}_{i+1}$(Vb−Va)/2 with $\overline{B}_{i+1}$ equal to 1−$B_{i+1}$. Residual voltage V2 can also be written in the form V2=4Vin−2$\overline{Bi}$·Va−2 Bi·Vb−$B_{i+1}$·Vb−$\overline{B}_{i+1}$·Va with $\overline{B}_{i+1}$ equal to 1−$B_{i+1}$.

Second intermediate voltage V2 is calculated by means of capacitors and in particular capacitors C1, C2, C3 and C4 which were charged with voltage Vin and capacitors C2 and C3 which now receive voltage $V_{Bi}$ and capacitor C4 which receives voltage $V_{Bi+1}$.

The same amplifier is used to perform the sampling step and the calculation step which enables the voltage shift introduced by the amplifier to be eliminated. This solution is more advantageous than the configuration where voltage Vamp is applied directly on one of the terminals of capacitors C1, C2, C3 and C4. In this case, the voltage shift linked to the amplifier is in fact introduced into calculation of the intermediate voltage and into calculation of the residual voltage which means that errors are liable to be introduced into the following calculations. In an advantageous embodiment as it is very compact and very precise, the amplifier always comprises one of these input terminals connected to one of the armatures of capacitors C1, C2, C3 and C4.

Voltage source 8 can comprise three power supply terminals which respectively receive voltage to be converted Vin and voltages Va and Vb. Thus, depending on the period and the values of bits Bi and $B_{i+1}$, the voltage source is able to provide the suitable voltage to each power supply line. Depending on the periods, the power supply source provides voltage to be converted Vin, the first reference voltage from Va and Vb and the second reference voltage from Va and Vb.

To sum up, voltage source 8 is configured:
  to apply voltage to be converted Vin on a second terminal of first, second, third and fourth capacitors C1, C2, C3 and C4 during a first period,
  to apply a first reference voltage $V_{Bi}$ on the second terminal of second capacitor C2 during a second and third period, first reference voltage $V_{Bi}$ being representative of first digital value Bi,
  to apply first reference voltage $V_{Bi}$ on the second terminal of third capacitor C3 during the third period,
  to apply a second reference voltage $V_{Bi+1}$ on the second terminal of fourth capacitor C4 during the third period, second reference voltage $V_{Bi+1}$ being representative of second digital value $B_{i+1}$.

In an advantageous embodiment, voltage source 8 comprises a first series of switches or a first group of switches connecting a generator of voltage to be converted Vin to the second terminals of the first, second, third and fourth capacitors, the switches of the first series having a control electrode connected to a generator of a first signal S1. The voltage generator can be the input terminal of the stage, a sample and hold stage which delivers the voltage to be converted or any other component of the circuit able to deliver voltage Vin.

In an advantageous embodiment, voltage source 8 comprises a second series of switches or a second group of switches connecting a generator of first reference voltage $V_{Bi}$ to the second terminal of the second capacitor, the switch having a control electrode connected to a generator of a second signal S2.

In an advantageous embodiment, voltage source 8 comprises a third series of switches or a third group of switches connecting a generator of second reference voltage $V_{Bi+1}$ to the second terminal of the fourth capacitor and connecting a generator of first reference voltage $V_{Bi}$ to the second terminal of the third capacitor, the switches of the third series having a control electrode connected to a generator of a third signal S3.

It is apparent that operation of the calculator is different from operation of converters of the prior art. In converters of the prior art, the first intermediate voltage is calculated and is reinjected into the second calculator to calculate residual voltage V2. According to the invention, the intermediate voltage is calculated in one step from voltages Vin, Va and Vb. The residual voltage is then calculated using voltages Vin, Va and Vb without using the intermediate voltage. Precision is thus enhanced. In comparison with the document U.S. Pat. No. 8,344,926, the converter is more compact as a part of the components is mutualised. As the amplifier is mutualised, the drifts in time are more easily correctable. As the converter comprises less components, there is less dispersion in the results. In the prior art, in order to limit the volume, the amplifier forming the multiplier by two (×2) was in fact chosen with modest performances. However, it became apparent that this led to a large dispersion of the results on the value of the first bit. In the embodiments presented, in addition to the gain in compactness, there is a gain on the precision of the results obtained. This impairment of the results of the circuits of the prior art can be found on voltage V2 and on the subsequent bits, which requires a great deal of calibration work.

In an advantageous embodiment of this two-bit analog-to-digital converter, conversion is performed at each iteration and is broken down into a plurality of elementary phases which can each comprise one or more clock cycles. For example purposes, depending on the number of sample and hold devices integrated in the converter and their arrangement in the circuit, the number of clock signals will in fact vary to obtain a result similar to $4Vin-(Va+Vb)+Bi \cdot (Va-Vb)+Bi \cdot (Vb-Va)-(Va+Vb)/2+B_{i+1} \cdot (Va-Vb)/2+\overline{B}_{i+1}(Vb-Va)/2$.

Figure 8:
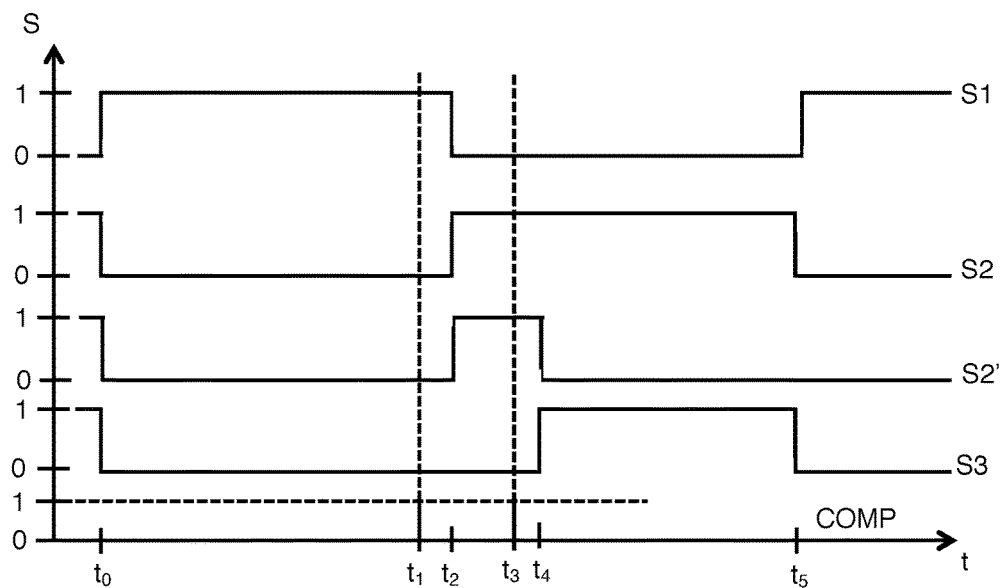
FIG. 8 represents a timing diagram of activation of the different switches and comparators of a successive approximation converter according to the invention, in schematic manner.

As an example illustrated in FIG. 8, a possible operation of the embodiment illustrated in FIG. 4 is explained for an iteration. In a first period starting at time to, voltage to be converted Vin is applied to the converter input. In this first period, at a time $t_1$, voltage to be converted Vin is sampled.

At time $t_1$, voltage to be converted Vin is compared with first comparison voltage Vref1, and depending on whether voltage to be converted Vin is higher or lower than comparison voltage Vref1, the comparator delivers a first bit Bi respectively equal to 1 or 0.

Advantageously, comparison with comparison voltage Vref1 is performed at the end of the period, just before $t_2$, when the signal is well established.

At time $t_2$, the second period starts. The second switch T2 is on and the calculator delivers intermediate voltage V1. Calculation is performed in particular according to first bit Bi determined during the first period.

At time $t_3$, intermediate voltage V1 is compared with the comparison voltage. Depending on whether intermediate voltage V1 is higher or lower than comparison voltage Vref2, the comparator delivers a second bit $B_{i+1}$ respectively equal to 1 or 0. Comparison is preferably performed at the end of the second period but above all before the beginning of the third period.

In the third period starting at time $t_4$, the calculator calculates residual voltage V2, according to first bit Bi, determined at time $t_1$, and to second bit $B_{i+1}$ determined at time $t_3$. First intermediate voltage V1 is not used by calculator 6 in order not to introduce errors linked to calculation of voltage V1 in calculation of residual voltage V2.

As illustrated in FIG. 8, the generator of first signal S1 turns the associated switches on between times $t_0$ and $t_2$. At time $t_2$, the generator of first signal S1 turns the associated switches off. At time $t_2$, the generator of second signal S2 turns the associated switches on. At time $t_4$, the generator of third signal S3 turns the associated switches on. The switches associated with signal S2 are in on state and those associated with signal S1 are in off state. At time $t_5$, the generator of second signal S2 and the generator of third signal S3 turn the associated switches off. At time $t_5$, the generator of first signal S1 turns the associated switches on.

In general manner, in a first stage the converter performs extraction of first bit Bi and then in a second stage extraction of second bit $B_{i+1}$ by means of voltage Vin, first Va and second Vb voltages and first bit. In this way, the converter does not allow an increase of the conversion rate, but enables an increase of the precision of conversion and a reduction of the power consumption.

In a privileged embodiment illustrated in FIG. 9, means for comparing 2 and 5 comprise an architecture of redundant signed digit (RSD) type which enables a more robust operation of the converter. By means of this particular architecture, the imprecisions linked to the comparators present in means for comparing 2 and 5 are reduced. The range accessible to voltage to be converted Vin and to the intermediate voltages is divided into an odd number of sub-ranges, for example three sub-ranges. For a breakdown into three sub-ranges, means for comparing 2 and 5 each comprise two elementary comparators. The means for comparing then deliver a digital result on two bits. However, as these two bits are not able to take all the possible values, it is necessary to rework this digital signal in order to turn it into a real binary signal. The first elementary comparators of means for comparing 2 and 5 have a first input terminal connected to a first elementary comparison voltage $Vref^-$ and a second input terminal respectively connected to voltage to be converted Vin and to the first intermediate voltage. In this way, the first elementary comparators perform comparison of the voltage to be converted or of first intermediate voltage V1 with the first elementary comparison voltage. A similar connection and operation are implemented for the second elementary comparators of means for comparing 2 and 5. The second elementary comparators perform comparison of voltage to be converted Vin or of first intermediate voltage V1 with second elementary comparison voltage $Vref^+$.

In this particular embodiment, the range accessible to voltage to be converted Vin is divided into three sub-ranges by means of first and second elementary comparison voltages Vref⁻ and Vref⁺. The first and second elementary comparison voltages are voltages which are situated in the range defined by first Va and second Vb voltages. The accessible voltage range being divided into three sub-ranges that are equal or not, means for comparing 2 and 5 each deliver two elementary bits $B_i^-$, $B_i^+$ and $B_{i+1}^-$, $B_{i+1}^+$ on output. The values of the different bits represent the positioning of voltage to be converted Vin or of first intermediate voltage V1 in the accessible range. All the combinations between bits $B_i^-$ and $B_i^+$ or between bits $B_{i+1}^-$ and $B_{i+1}^+$ are therefore not possible. In this particular embodiment, the converter comprises transcription means of the elementary bits obtained in the different iterations into a binary format representative of voltage to be converted Vin. Construction of a converter with an architecture of RSD type is described for example by Ginetti et al. in the publication cited in the foregoing.

In this particular architecture, the calculator takes account of the presence of the two elementary bits delivered by means for comparing 2 and 5. By defining (Va+Vb)/2≤Vref⁺<(Va+Vb)/2+(Vb−Va)/4 and (Va+Vb)/2+(Va−Vb)/4<Vref≤(Va+Vb)/2, the voltage delivered by the means for calculating can be defined as being equal to 2Vin−($B_i^-$ AND $B_i^+$)·Vb−($B_i^-$ OREX $B_i^+$)·(Va+Vb)/2−($\overline{B_i^-}$ AND $\overline{B_i^+}$). Va, the residual voltage V2 delivered by the means of calculating, can for its part be defined as being equal to 4Vin−2($B_i^-$ AND $B_i^+$)·Vb−2($B_i^-$ OREX $B_i^+$)·(Va+Vb)/2−2($\overline{B_i^-}$ AND $\overline{B_i^+}$)·Va−($B_{i+1}^-$ AND $B_{i+1}^+$)·Vb−($B_{i+1}^-$ OREX $B_{i+1}^+$)·(Va+Vb)/2−($\overline{B_{i+1}^-}$ AND $\overline{B_{i+1}^+}$)·Va, AND and OREX (exclusive OR) represent the Boolean operator. These equations can also be written in the same form as previously. This architecture is advantageous, as a comparator presenting less high performances can be used.

This particular architecture also enables the precision of the converter to be increased for the same digital resolution, i.e. for a conversion on the same number of bits. By means of such a converter which integrates means for calculating on two binary signals, the degradations of the analog signal on output A of the converter are reduced compared with use of two successive stages each having their own means for calculating intermediate voltages. Furthermore, this separation of digital encoding and calculation of an analog residue enables the properties of these two branches be optimised and a residue, i.e. a second intermediate voltage, to be delivered on the converter output with better precision. This second intermediate voltage being used to obtain the two successive bits, this then results in an increase of the precision of the binary code originating from conversion of voltage Vin. This architecture also enables the consumption and volume to be reduced compared with other analog-to-digital converters on two bits (i.e. two converters on one bit connected in series), which makes it a particularly advantageous architecture.

This advantageous embodiment is presented in relation with the embodiment of FIG. 4. As a variant, this embodiment can also be used in the embodiment illustrated in FIG. 3.

Figure 10:
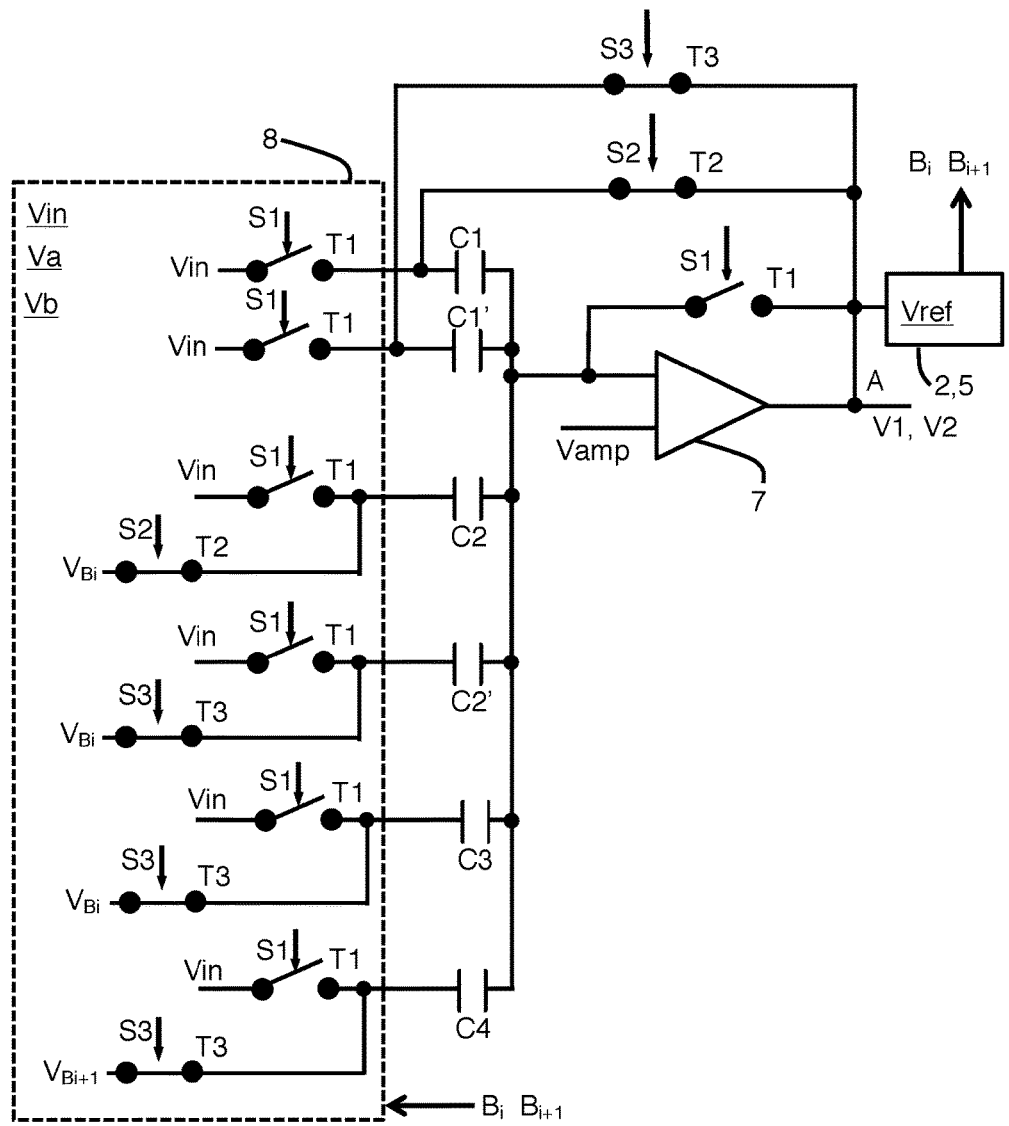

In an advantageous embodiment illustrated in FIG. 10, the converter comprises two additional power supply lines connected in parallel to the four power supply lines already described. The two additional power supply lines are similar to the previous lines with a first switch T1 which receives signal S1 to enable or disable application of voltage Vin on a second terminal of the additional capacitor.

The first additional power supply line comprises a first additional capacitor C1'. The second terminal of first additional capacitor C1' is connected to the output of amplifier A by means of a third switch T3 which receives signal S3. The first terminal of capacitor C1' is connected to amplifier 7.

The second additional power supply line comprises a second additional capacitor C2'. The second terminal of second additional capacitor C2' is connected to receive first reference voltage $V_{Bi}$ via a third switch T3 which receives signal S3.

The electric capacitance value of first capacitor C1 is equal to the value of second capacitor C2. The sum of the values of the electric capacitances of first capacitor C1 and of first additional capacitor C1' is equal to the sum of the values of the electric capacitances of second capacitor C2 and of first additional capacitor C2'. The sum of the values of the electric capacitances of first capacitor C1 and of first additional capacitor C1' is equal to the electric capacitance value of third capacitor C3 and of fourth capacitor (C1+C1'=C2+C2'=C3=C4; C1=C2; C1'=C2').

Reducing the electric capacitance value of first and second capacitors C1 and C2 enables a stationary state to be reached more quickly. It is then possible to calculate first voltage V1 and to determine second bit $B_{i+1}$ more quickly. In comparison with the previous embodiments, a more precise result and/or a shorter time period can be obtained.

In particularly advantageous manner, in order to reduce the time required to charge capacitors C1 and C2, the value of C1 is less than half the value of C1' and even more preferentially C1=C1'/10.

The embodiment illustrated in FIG. 10 can be implemented with the comparators of FIG. 4 or with the comparators of FIG. 9.

It is then possible to combine the different proposed converter architectures without making the timing diagram more complex.

Figure 11:
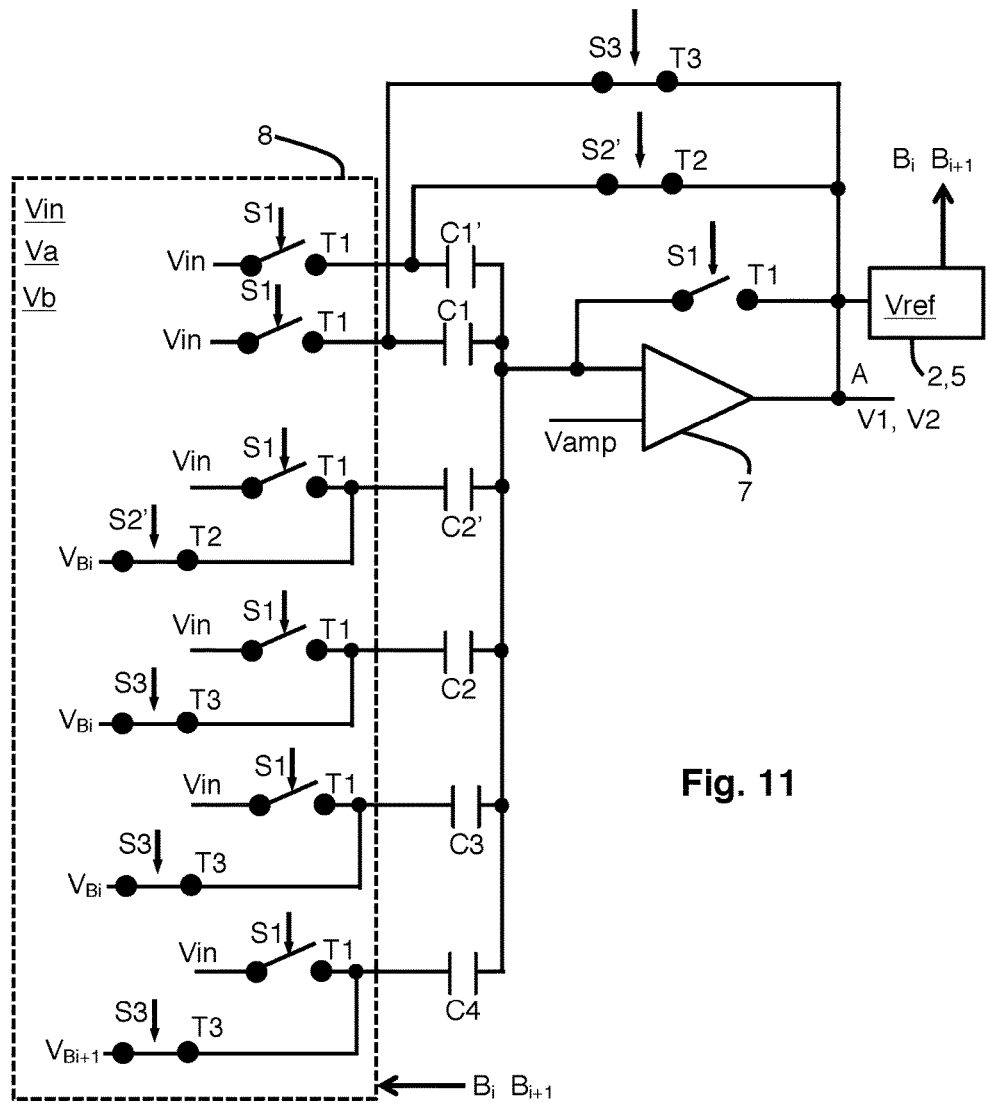

In an alternative embodiment illustrated in FIG. 11, the electric capacitance value of first capacitor C1 is equal to the value of second capacitor C2. The sum of the values of the electric capacitances of first capacitor C1 and of first additional capacitor C1' is equal to the sum of the values of the electric capacitances of second capacitor C2 and of first additional capacitor C2'. The value of the electric capacitances of first and second additional capacitors C1' and C2' is equal to the electric capacitance value of third capacitor C3 and of fourth capacitor C4 (C1'=C2'=C3=C4). The electric capacitance value of first capacitor C1 is lower than the value of first additional capacitor C1' by at least 10%.

Reducing the electric capacitance value of first and second capacitors C1 and C2 enables a stationary state to be reached more quickly. It is then possible to calculate first voltage V1 and to determine second bit $B_{i+1}$ more quickly. In comparison with the previous embodiments, a more precise result can be obtained and/or on a shorter time period. This embodiment is less compact than the previous one.

In particularly advantageous manner, in order to reduce the time required to charge capacitors C1 and C2, the value of C1 is less than half the value of C1' and even more preferentially C1=C1'/10.

This embodiment is particularly advantageous as the signals stored on capacitors C1 and C2 are used to determine second bit $B_{i+1}$, but not to calculate voltage V2.

The stray charges emitted by the amplifier when reading the signals to determine second bit $B_{i+1}$ are not stored in capacitors C1' and C2' which ensures a better precision for the subsequent conversions. It is then advantageous to replace signal S2 by signal S2'. Signal S2' is configured to turn second switch T2 off when third switch T3 is on.

Signals S2 and S2' are illustrated in the timing diagram of FIG. 8.

In an advantageous embodiment, when the converter is in an architecture called pipeline architecture, the two successive stages are in phase opposition. Under these conditions, one of the stages performs sampling while the other stage performs the multiplication operation and vice versa.

In even more general manner, the successive approximation converter can deliver more than two bits with more stages. It then comprises a succession of approximation stages with at least twice less stages than the delivered bits. In the case where the converter comprises a plurality of stages, each stage comprises an input and an analog output, a calculator and at least one comparator depending on the type of breakdown of the conversion range. Each stage delivers a digital result or a digital output, for example a bit and an analog voltage on the analog output. It is this analog voltage which is used to determine the digital result of the following stage or the residual voltage of the converter.

Each calculator is connected to the input terminal of the converter to receive input voltage Vin, to its associated comparator to receive the digital result of its stage and to the comparators of the previous stages delivering the most significant bits in order to calculate and deliver the analog voltage of this stage. Each comparator is connected to the output terminal of the previous stage in order to deliver a digital result representative of the analog voltage of the previous stage. A stage therefore receives an analog signal coming from the previous stage to determine a digital value and it delivers an analog voltage to the next stage. Analog output A of the converter is connected to an input of the second calculator, i.e. the calculator of the second stage.

The converter has been presented so as to provide 2 bits per stage but it is also possible to deliver more bits using the same general architecture and in particular using the same amplifier 7 to deliver all the intermediate voltages Vi and the residual voltage.

The comparator connected to the output of amplifier 7 is used to deliver all the bits or at least all the bits except for the first bit.

Figure 12:
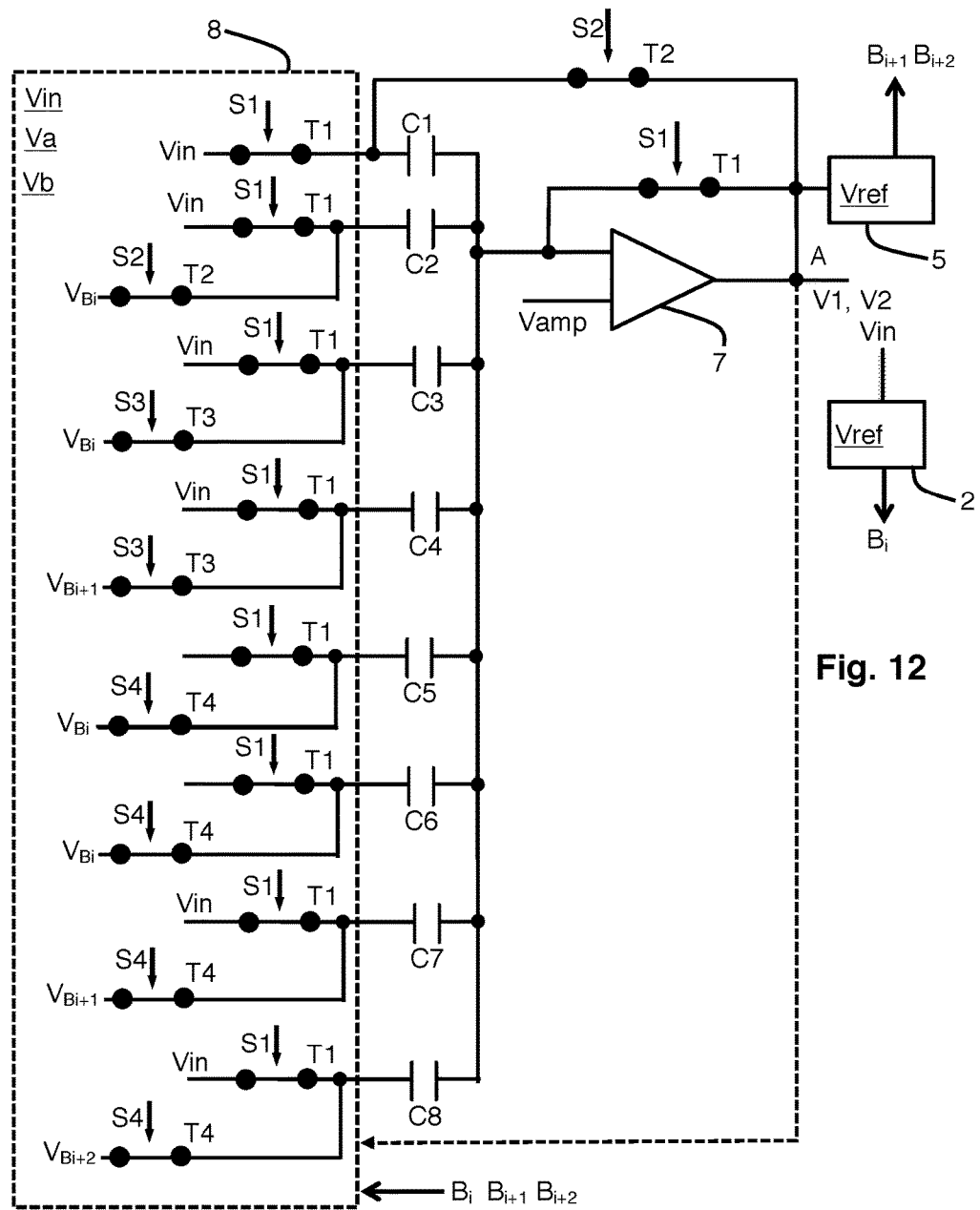
FIG. 12 represents a particular embodiment of a 3-bit converter according to the invention.

In the embodiment illustrated in FIG. 12 and which is constructed with the same architecture presented in the embodiment of FIG. 4, the converter comprises 8 power supply lines connected in parallel and it enables 3 bits to be delivered per stage.

The 3-bit converter comprises all the components of the 2-bit converter. It further comprises additional power supply lines, an additional signal generator and at least one additional reference voltage. The different embodiments of the 2-bit converter can be used.

The four additional power supply lines are a reproduction of the configurations of the previous power supply lines with the exception of the first power supply line. The fifth line is identical to the second line. The sixth line is identical to the third line. The seventh line is identical to the fourth line. The eighth power supply line comprises an eighth capacitor C8 which can receive voltage Vin via a first switch commanded by signal S1 or third reference voltage $V_{Bi+2}$ via a fourth switch commanded by signal S4.

On these four additional lines, the first, second and third reference voltages are applied on the capacitors via a fourth switch commanded by a signal S4 so as to be able to define a new comparison period and a new calculation period of a new voltage which will become the residual voltage.

The first, second and third periods are identical to what was described in the foregoing. During the third period, the voltage delivered by amplifier 7 is compared with a third comparison voltage which is advantageously equal to the first and second comparison voltages Vref.

During the fourth period, the second, third and fourth switches are on and the amplifier delivers the residual voltage which is a function of voltage Vin, voltages Va and Vb and the values of the first, second and third bits. The first switches are off. According to the embodiments, the second and third switches are off or on.

Figure 13:
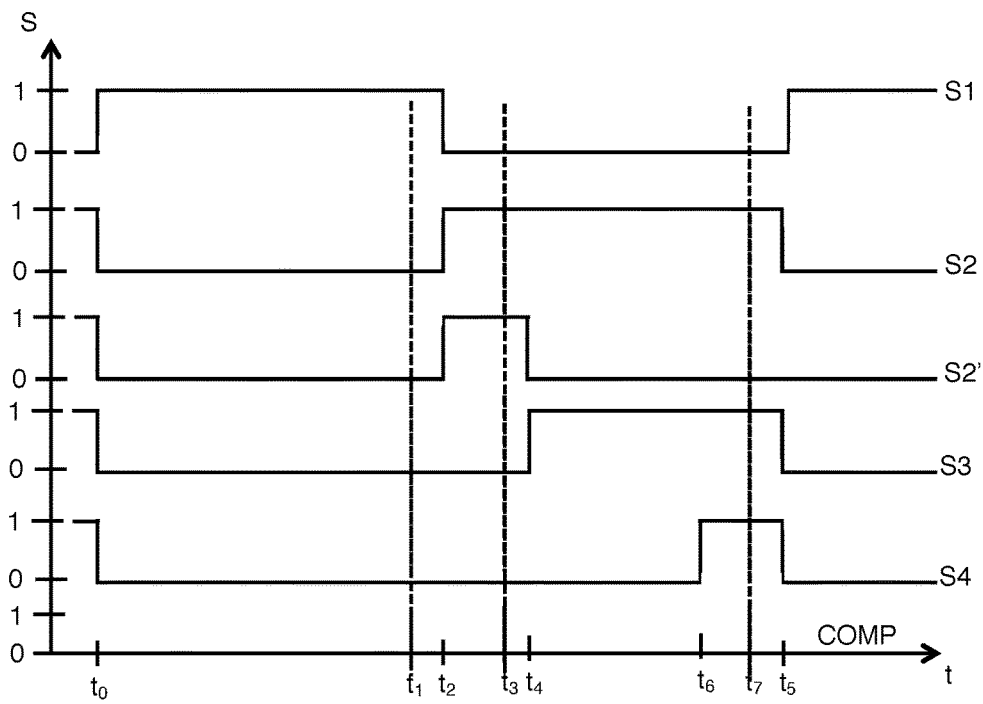
FIG. 13 represents a timing diagram of activation of the different switches and comparators of a successive approximation converter according to the invention, for a 3-bit converter, in schematic manner.

The timing diagram of FIG. 13 illustrates a possible operation for a 3-bit converter. It presents the same diagram as the timing diagram of FIG. 8 and defines a fourth period where the fourth switches switch to on state. At time $t_6$, signal S4 makes the fourth switches switch to on state. At time $t_7$, the comparator compares the voltage delivered by the amplifier with a reference voltage to deliver the third digital data, here third bit $B_{i+2}$. At time $t_5$, the second, third and fourth switches switch to off state.

The 3-bit converter can also integrate the different alternative embodiments presented for the 2-bit converter, for example the alternative embodiment illustrated in FIGS. 10 and 11 as the 3-bit converter comprises the components of the 2-bit converter. The advantages presented in the foregoing are kept. In general manner, the converter on n bits can integrate the different alternative embodiments presented for the 2-bit converter.

In more general manner, the converter can be configured to deliver n bits with n being an integer greater than 2. To deliver n bits, the architecture presented is identical to the one presented for 2 bits and 3 bits.

The converter comprises 2n power supply lines which are each provided with a capacitor. The voltage source is connected to each of the power supply lines and delivers the suitable voltage for each of the at least n+1 periods used.

The converter calculates n voltages, i.e. n−1 intermediate voltages and a residual voltage. Voltage to be converted Vin and the n−1 intermediate voltages are compared with comparison voltages to deliver the n bits of the converter.

Conversion is performed using at least n+1 periods and therefore advantageously n+1 signal generators and n+1 series of switches in order to provide voltages $V_{in}$, $V_{Bi}$, $V_{Bi+1}$, $V_{Bi+2}$ . . . and $V_{Bi+n-1}$ on the second terminals of the capacitors.

The converter delivering n bits comprising:
  $2^n$ power supply lines connected in parallel each with a capacitor,
  each power supply line receiving voltage Vin by means of a first transistor receiving signal S1.

The converter delivering n bits comprises the same components as the converter delivering n−1 bits. It advantageously operates in the same way to calculate the intermediate voltages and to calculate the n−1 first bits.

A converter on n bits comprises a converter on n−1 bits and also $2^{n-1}$ additional power supply lines. These $2^{n-1}$ additional lines each comprise a capacitor which is connected to voltage source 8. Voltage source 8 is configured deliver all the reference voltages up to rank n by means of $2^{n-1}$ additional outputs which are a copy of the outputs used by the converter of rank n−1 to deliver the reference voltages. The last additional output is used to deliver the last reference voltage necessary for calculating the residual voltage.

Voltage source 8 is configured to apply voltage Vin during the first period on the $2^{n-1}$ additional outputs. Voltage source 8 is configured to apply the last reference voltage during the period of rank n+1. Such a converter is particularly advantageous as it uses an amplifier 7 to calculate the various intermediate voltages and the residual voltage. The residual voltage of the 2-bit converter is the last intermediate voltage of the 3-bit converter and the residual voltage of the 3-bit converter will be the last intermediate voltage of the 4-bit converter.

In advantageous manner, the converter comprises a control circuit which is configured to perform the different steps described in the foregoing.

The invention claimed is:

1. Analog-to-digital converter comprising:
   an input terminal receiving a voltage to be converted, the voltage to be converted being comprised in a conversion range bounded by a first voltage and a second voltage,
   an amplifier having a first input terminal and an output terminal forming an analog output terminal of the converter,
   a first switch connecting the input terminal of the amplifier and the output terminal of the amplifier,
   first, second, third and fourth connections connected in parallel to the input terminal of the amplifier, each connection respectively comprising first, second, third and fourth capacitors having a first terminal connected to the first input terminal of the amplifier,
   a second switch connecting a second terminal of the first capacitor to the output terminal of the amplifier,
   a first comparator receiving the voltage to be converted and at least one first comparison voltage and configured to perform comparison between the voltage to be converted and the at least one first comparison voltage, and to deliver, on a first digital output, a first digital value on at least a first bit representative of said comparison,
   a second comparator receiving a first intermediate voltage and at least a second comparison voltage and configured to perform comparison between the first intermediate voltage and the at least one second comparison voltage, and to deliver, on a second digital output, a second digital value on at least a second bit representative of said comparison,
   a voltage source configured to:
   apply the voltage to be converted on a second terminal of the first, second, third and fourth capacitors during a first period,
   apply a first reference voltage on the second terminal of the second capacitor during a second and third periods, the first reference voltage being representative of the first digital value,
   apply the first reference voltage on the second terminal of the third capacitor during the third period,
   apply a second reference voltage on the second terminal of the fourth capacitor during the third period, the second reference voltage being representative of the second digital value,
   a control circuit configured to calculate, by means of the amplifier and the second switch,
   the first intermediate voltage from the voltage to be converted, from the first digital value and from said first voltage and second voltage,
   a second intermediate voltage from the voltage to be converted, from the first and second digital values and from said first voltage and second voltage.

2. Converter according to claim 1, wherein the first comparator and the second comparator are formed by a single comparator and wherein a selector switch is configured to connect the input terminal of the comparator to the output terminal of the amplifier or to the input terminal receiving the voltage to be converted.

3. Converter according to claim 1, wherein the voltage source comprises a group of first switches connecting a generator of the voltage to be converted to the second terminals of the first, second, third and fourth capacitors, the group of first switches having a control electrode connected to a generator of a first signal.

4. Converter according to claim 1, wherein the voltage source comprises a group of second switches connecting a generator of the first reference voltage to the second terminal of the second capacitor, the group of second switches having a control electrode connected to a generator of a second signal.

5. Converter according to claim 1, wherein the voltage source comprises a group of third switches connecting a generator of the first reference voltage to the second terminal of the third capacitor and connecting a generator of the second reference voltage to the second terminal of the fourth capacitor, the group of third switches having a control electrode connected to a generator of a third signal.

6. Converter according to claim 1, wherein the value of the first reference voltage depends solely on the first digital value.

7. Converter according to claim 1, wherein the value of the second reference voltage depends solely on the second digital value.

8. Converter according to claim 1, wherein the second intermediate voltage is representative of $$4Vin-(Va+Vb)+Bi \cdot (Va-Vb)+ \overline{Bi} \cdot (Vb-Va)-(Va+Vb)/2+B_{i+1} \cdot (Va-Vb)/2+ \overline{B}_{i+1} \cdot (Vb-Va)/2$$

with
Va: the first voltage,
Vb: the second voltage,
Vin: the tension to be converted,
Bi: the first digital value,
$B_{i+1}$: the second digital value.

9. Converter according to claim 1, wherein the first comparator is formed by two comparators on one bit delivering a first digital value defined by first and second elementary bits.

10. Converter according to claim 9, wherein the second comparator is formed by two comparators on one bit delivering a second digital value defined by third and fourth elementary bits.

11. Converter according to claim 10, wherein the second intermediate voltage is representative of $$4Vin-2(Bi^- \text{ AND } Bi^+) \cdot Vref^+ -2(Bi^- \text{ OR } Bi^+) \cdot (Va+Vb)/2-2(\overline{Bi^-} \text{ AND } \overline{Bi^+}) \cdot Vref^- -(B_{i+1}^- \text{ AND } B_{i+1}^+) \cdot \underline{Vref^+} -(B_{i+1}^- \text{ OR } B_{i+1}^+) \cdot (Va+Vb)/2-(\overline{B_{i+1}^-} \text{ AND } \overline{B_{i+1}^+}) \cdot Vref^-$$

with
Va: the first voltage,
Vb: the second voltage,
Vin: the tension to be converted,
$Vref^+$, $Vref^-$: first and second elementary comparison voltages,
$Bi^-$, $Bi^+$: the first and second elementary bits,
$B_{i+1}^-$, $B_{i+1}^+$: the third and fourth elementary bits.

12. Converter according to claim 1, further comprising first and second additional connections connected in parallel to the input terminal of the amplifier and respectively comprising first and second additional capacitors, a second terminal of the first additional capacitor being connected to the output of the amplifier by means of a switch of the group of the third switches, a second terminal of the second additional capacitor being connected to receive the first reference voltage via a switch of the group of the third switches.

13. Converter according to claim 1, wherein the first switch is configured to directly connect the input terminal of the amplifier and the output terminal of the amplifier.

14. Operating method of an analog-to-digital converter comprising:
providing an analog-to-digital converter comprising
an amplifier having a first input terminal and an output terminal forming an analog output terminal of the converter,
a first switch connecting the input terminal of the amplifier and the output terminal of the amplifier,
first, second, third and fourth connections connected in parallel to the input terminal of the amplifier, each connection respectively comprising first, second, third and fourth capacitors having a first terminal connected to the first input terminal of the amplifier,
sampling a voltage to be converted during a first period by applying said voltage to be converted to second terminals of the first, second, third and fourth capacitors, the voltage to be converted being comprised in a conversion range bounded by a first voltage and second voltage, the amplifier being connected as a follower by means of the first switch,
comparing the voltage to be converted with a first comparison voltage by means of a first comparator and delivering a first digital value on at least a first bit,
applying a first reference voltage on the second terminal of the second capacitor, during a second period, the first reference voltage being representative of the first digital value,
calculating a first intermediate voltage by means of the amplifier and the first and second capacitors, from the voltage to be converted and the first reference voltage,
comparing the first intermediate voltage with a second comparison voltage by means of a second comparator and delivering a second digital value on at least a second bit,
during a third period, applying the first reference voltage on the second electrode of the third capacitor and applying a second reference voltage on the second terminal of the fourth capacitor, the second reference voltage being representative of the second digital value,
calculating a second intermediate voltage by means of the amplifier and the first, second, third and fourth capacitors, from the voltage to be converted, the first reference voltage and the second reference voltage.

* * * * *